United States Patent
Tezuka

Patent Number: 5,999,247
Date of Patent: Dec. 7, 1999

[54] EXPOSURE METHOD AND EXPOSURE SYSTEM

[75] Inventor: Tatsurou Tezuka, Tokyo, Japan

[73] Assignee: NEC Corporation, Tokyo, Japan

[21] Appl. No.: 08/687,844

[22] Filed: Jul. 26, 1996

[30] Foreign Application Priority Data

Jul. 28, 1995 [JP] Japan ..................................... 7-193432

[51] Int. Cl.$^6$ ........................... G03B 27/72; G03B 27/74; G03B 27/42
[52] U.S. Cl. .................. 355/71; 355/68; 355/53
[58] Field of Search ................................ 355/53, 55, 67, 355/68, 69, 71; 356/399, 400, 401; 250/201.1, 548, 559.3

[56] References Cited

U.S. PATENT DOCUMENTS

| | | | |
|---|---|---|---|
| 4,952,815 | 8/1990 | Nishi ..................................... | 250/548 |
| 5,124,216 | 6/1992 | Giapis et al. ........................... | 356/354 |
| 5,409,538 | 4/1995 | Nakayama et al. ..................... | 356/381 |
| 5,591,958 | 1/1997 | Nishi et al. ............................. | 356/400 |
| 5,635,722 | 6/1997 | Wakamoto et al. .................... | 250/548 |
| 5,646,413 | 7/1997 | Nishi ..................................... | 356/401 |

FOREIGN PATENT DOCUMENTS

| | | |
|---|---|---|
| 898678 | 10/1958 | France . |
| 4-148527 | 5/1992 | Japan . |
| 9209220 | 9/1992 | Japan . |
| 7220989 | 8/1995 | Japan . |

*Primary Examiner*—Richard Moses
*Attorney, Agent, or Firm*—Hayes Soloway Hennessey Grossman & Hage PC

[57] ABSTRACT

An exposure system and method that can optimize the exposure of an optical resist film independent of the chemical reaction of the resist film due to optical exposure. The optimum exposure time is measured using a first optical resist film and a first semiconductor wafer, and the data thus obtained is stored in a memory. Then, a second optical resist film on a second semiconductor wafer is exposed to the same exposing light, and the intensity of the reflected light for the second resist film and the second wafer at the start of exposing is measured. The stored data of the optimum exposure time for the first resist film and the first wafer is read out, and is used as the optimum exposure time for the second resist film and the second wafer.

5 Claims, 8 Drawing Sheets

EXPOSURE METHOD AND EXPOSURE SYSTEM

BACKGROUND OF THE INVENTION

1. Field of the Invention

The present invention relates to an exposure process and more particularly, to an exposure method and an exposure system that are effective for transferring patterns of geometrical shapes on an exposure mask to an optical resist film on a semiconductor wafer in semiconductor device fabrication.

2. Description of the Prior Art

In the exposure process of semiconductor device fabrication, recently, the patterns of geometrical shapes to be transferred have been miniaturized and at the same time, the wavelength of the exposing light has been decreased more and more. As a result, the multiple interference phenomenon of the exposing light has become unable to be ignored.

Specifically, since an optical resist film is formed on an underlying base material (typically, a semiconductor wafer or a conductive/insulating layer), the effective exposure energy of the film varies dependent upon the reflectance of the base material. Also, the effective exposure energy is affected by the optical absorption coefficient of the resist film. Accordingly, the exposure condition needs to be changed according to the combination of the resist film and the base material.

To cope with this need, conventionally, an exposure systems shown in FIG. 1 was developed, which was disclosed in the Japanese Non-Examined Patent Publication No. 4-148527 published in May 1992.

As shown in FIG. 1, this conventional exposure system is equipped with an optical detector 20 provided around a reduction projection lens system. Exposing light is illuminated through the lens system to an optical resist film formed on a semiconductor wafer, and is usually reflected by the wafer surface. The detector 20 detects the reflected light and outputs an electric signal to an integrating circuit 21.

The integrating circuit 21 serves to integrate the output signal during the exposure time, thereby obtaining the total optical energy of the reflected light.

On the other hand, the data of a preset exposure energy is input to a processor 22. The processor 22 converts the input data to the data of the optical energy.

A comparator 23 compares the data of the total optical energy of the actual reflected light sent by the integrating circuit 21 and the data of the optical energy sent by the processor 22. When both of the data accord with each other, the comparator 23 outputs a shutter closing signal to a shutter control circuit 24. The shutter control circuit 24 controls to close a shutter placed in the optical path of the exposure system, thereby stopping the exposure to the resist film.

When each exposure process starts, a start signal is input into the shutter control circuit 24. In response to the start signal, the circuit 24 outputs a reset signal to the integrating circuit 21. The operation of the circuit 21 is reset and restarts by the reset signal.

With the conventional exposure system shown in FIG. 1, the opening (i,e., exposing) time of the shutter can be controlled according to the base material having various reflectance values. Also, the shutter control is effective even when the resist film contains any dye and therefore has a reduced reflectance value.

Generally, the chemical reaction of an optical resist film due to optical exposure is affected by incident exposing light which is directly illuminated and reflected light which is reflected by an underlying base material. The exposed region of the resist film tends to become transparent due to a bleaching phenomenon, resulting in the increased transmittance and the increased intensity of the reflected light. Therefore, the intensity increase of the reflected light due to the optical exposure needs to be considered.

With the conventional exposure system shown in FIG. 1, however, the intensity increase of the reflected light is not considered during the integration process by the integrating circuit 21 and as a result, a problem that the exposure of the resist film is not always optimized occurs.

Further, the thickness of the optical resist film should be kept constant for all semiconductor wafers to be used. However, it is very difficult and consequently, some thickness fluctuation will take place. The thickness fluctuation of the resist film between the wafers causes to change the intensity of the reflected light.

Accordingly, with the conventional exposure system shown in FIG. 1, some error will occur in the exposure energy of the optical resist film. This error is also a cause of the above problem.

SUMMARY OF THE INVENTION

Accordingly, an object of the present invention is to provide an exposure method and an exposure system that can optimize the exposure of an optical resist film independent of the chemical reaction of the resist film due to optical exposure.

Another object of the present invention is to provide an exposure method and an exposure system that can optimize the exposure of an optical resist film even if the resist film has some thickness fluctuation.

Still another object of the present invention is to provide an exposure method and an exposure system that can control a shutter placed in an optical path of an exposing light to optimize the exposure of an optical resist film.

The above objects together with others not specifically mentioned will become clear to those skilled in the art from the following description.

According to a first aspect of the present invention, an exposure method is provided, which includes the following steps (a) to (i):

In the step (a), a first optical resist film formed at a first semiconductor wafer is prepared.

In the step (b), an exposing light is illuminated to the first resist film.

In the step (c), the intensity of a reflected light reflected by an underlying base material on the first wafer is measured at the start of exposure.

In the step (d), an optimum exposure time for the first resist film and the first wafer is measured.

In the step (e), a data of the optimum exposure time is stored in a memory.

In the step (f), a second optical resist film formed at a second semiconductor wafer is prepared.

In the step (g), the exposing light used in the step (b) is illuminated to the second resist film.

In the step (h), the intensity of a reflected light reflected by an underlying base material on the second wafer is measured at the start of exposure.

In the step (h), the data of the optimum exposure time stored in the memory is read out.

In the step (i), the exposure time for the second resist film and the second wafer is decided to accord with the data of the optimum exposure time thus read out.

With the exposure method according to the first aspect, the optimum exposure time is measured using the first optical resist film and the first semiconductor wafer, and the data thus obtained is stored in the memory. Then, the second optical resist film is exposed to the same exposing light, and the intensity of the reflected light for the second optical resist film and the second semiconductor wafer at the start of exposure is measured. The stored data of the optimum exposure time for the first resist film and the first wafer is read out and is used as the optimum exposure time for the second resist film and the second wafer.

Accordingly, the exposure time for the second optical resist film and the second semiconductor wafer is optimized independent of the chemical reaction of the resist film due to optical exposure.

Also, the exposure time for the second optical resist film and the second semiconductor wafer is optimized even if the resist film has some thickness fluctuation.

Further, by setting the opening time of a shutter placed in the optical path of the exposing light a value according to the stored data of the optimum exposure time, the shutter can be controlled to optimize the exposure of the second optical resist film.

In a preferred embodiment of the method according to the first aspect, the exposure energy per unit time is used instead of the intensity of the reflected light at the start of exposure.

In another preferred embodiment of the method according to the first aspect, the intensity data of the reflected light at the start of exposure for the first resist film is compensated according to the "pattern rate" of the mask. The patternrate may be said as the "transparency rate".

According to a second aspect of the present invention, an exposure system is provided, which includes a light source for producing an exposing light, a wafer stage for placing a semiconductor wafer thereon, a shutter for opening and closing an optical path of the exposing light to the wafer stage, an optical lens system for illuminating the exposing light to an optical resist film formed at the wafer, a detector for detecting a reflected light of the exposing light reflected by a base material of the resist film, a shutter controller for controlling the shutter to open and close in response to a control signal, and a processor for calculating an optimum exposing time from an intensity data of the reflected light obtained by the detector, for storing the intensity data thus calculated, and for outputting the control signal to the shutter controller to open at the start of exposure and to close the shutter according to the calculated optimum exposing time.

With the exposure system according to the second aspect, after the first semiconductor wafer having the fist optical resist film is placed on the wafer stage, the exposing light is illuminated to the first resist film through the opened shutter. Thus, a data of the optimum exposure time is measured for the first optical resist film and the first semiconductor wafer by the detector and the processor.

Then, the first wafer is replaced with the second semiconductor wafer with the first optical resist film, and the intensity of the reflected light for the second resist film and the second wafer is measured at the start of exposure by the detector and the processor in the same way as that of the first wafer.

The processor outputs the control signal to the shutter to close using the stored data of the optimum exposure time for the first resist film and the first wafer as the optimum exposure time for the second resist film and the second wafer.

Accordingly, the exposure time for the second optical resist film and the second semiconductor wafer is optimized even if the resist film has some thickness fluctuation, which is independent of the chemical reaction of the resist film due to optical exposure. The shutter can be controlled to optimize the exposure of the second optical resist film.

In a preferred embodiment of the system according to the second aspect, a pattten recognizer is additnoally provided for recognizing the pattern on the mask and for outputting a compensation signal to the processor.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to FIGS. 2 to 8 attached.

FIRST EMBODIMENT

Figure 1:
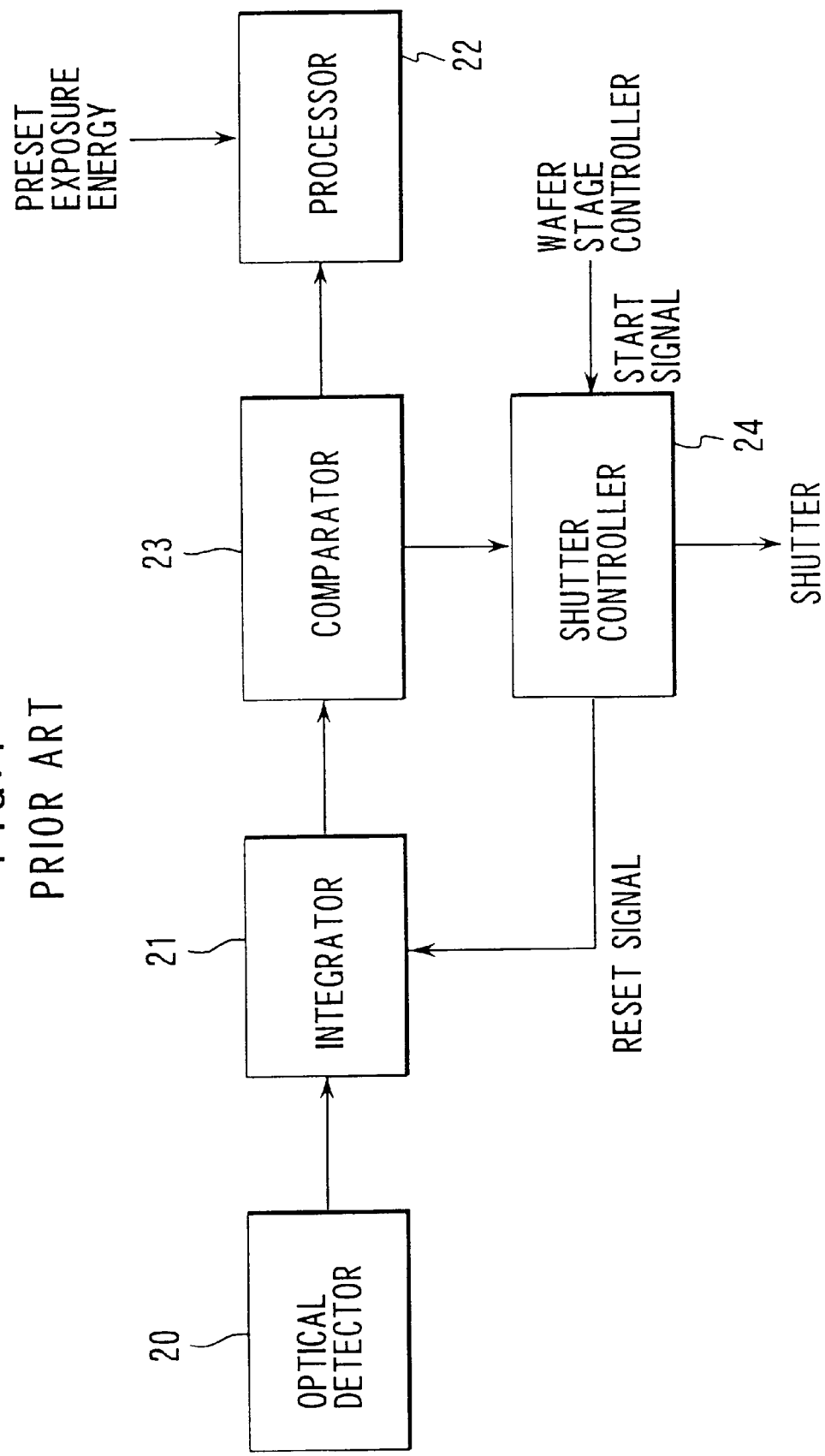
FIG. 1 is a schematic view showing the configuration of a conventional exposure system.
Figure 2:
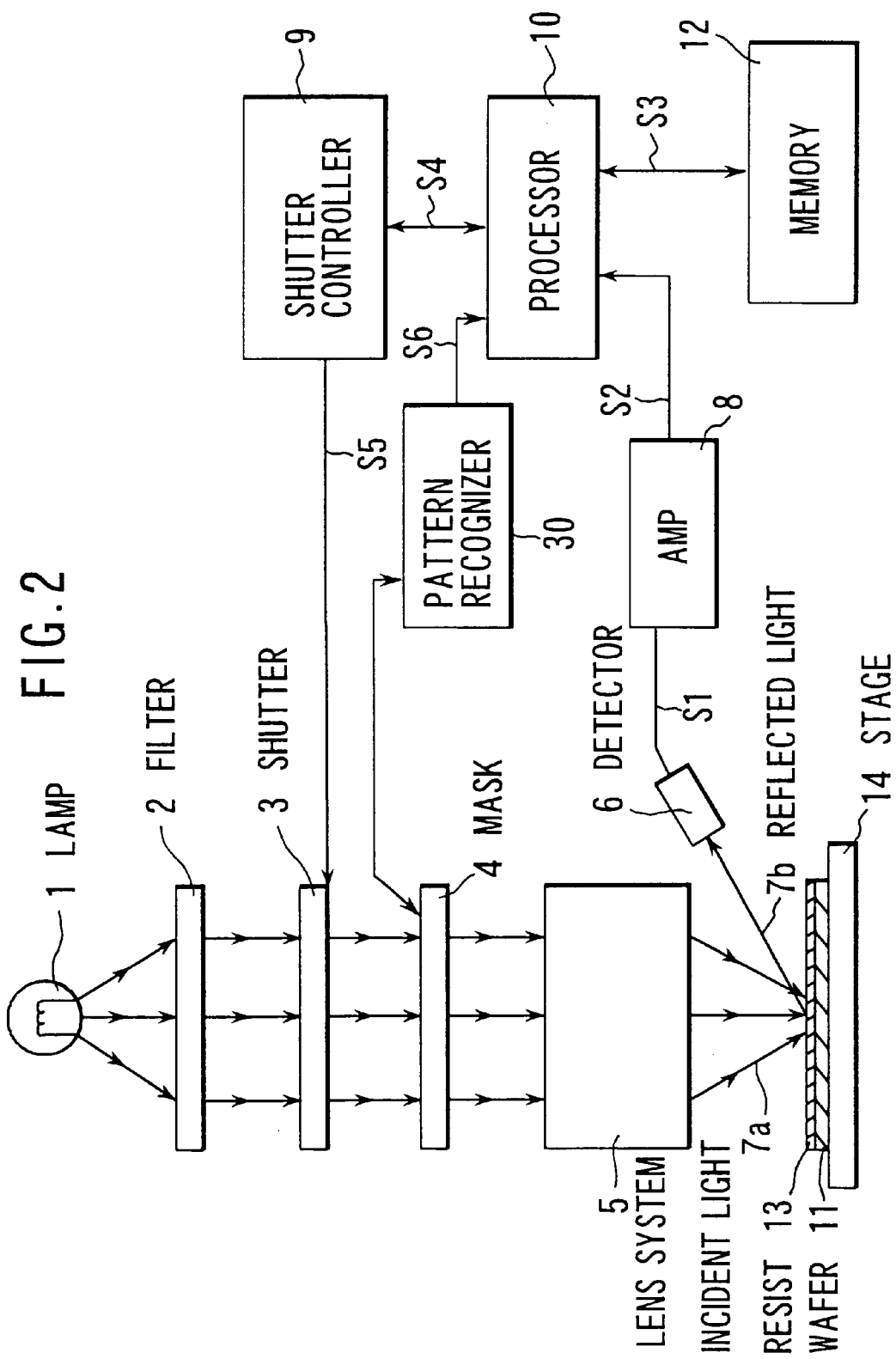
FIG. 2 is a schematic view showing the configuration of an exposure system according to a first embodiment of the invention.

As shown in FIG. 2, a reduction projection exposure system, which is used for an exposure method according to a first embodiment of the present invention, is equipped with a lamp 1, an optical filter 2, a shutter 3, an exposure mask 4, a reduction projection lens system 5, and a wafer stage 14.

The filter 2, the shutter 3, the mask 4 and the lens system 5 are located in an optical path of an exposing light. These components constitute an exposure section.

The lamp 1 serves as a light source for the exposing light and emits the light toward the filter 2. The filter 2 filters to pass a component with a wanted wavelength of the exposing light. The shutter 3 opens and closes the optical path to thereby control an exposure time.

Figure 8:
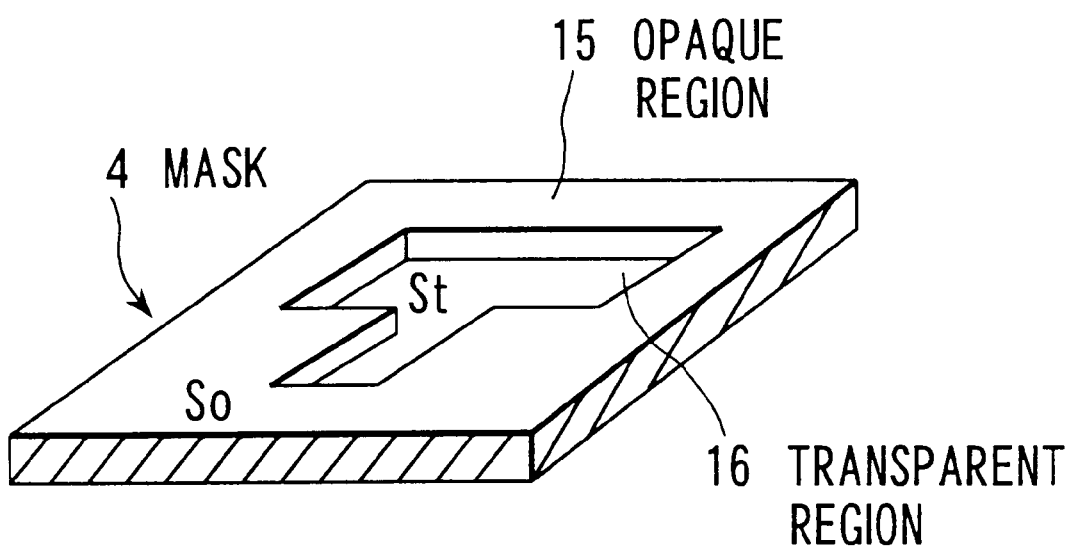
FIG. 8 is a schematic perspective view showing an exposure mask with an opaque area and a transparent area.

The mask 4 typically has a plurality of patterns of geometrical shapes to be transferred. However, for the sake of simplification, only one opaque region 15 and only one transparent region 16 are illustrated in FIG. 8. The opaque region 15 has an area $S_o$ and the transparent area 16 has an area $S_t$.

In this specification, the pattern rate is defined as the ratio of the area $S_o$ of the opaque region to the area $S_t$ of the transparent region, i.e., $(S_o/S_t)$.

The optical lens system 5 serves to project or illuminate the exposing light to an optical resist film 13 formed on a semiconductor wafer 11, which is placed on the wafer stage 14.

This exposure system further comprises an optical detector 6, an amplifier 8, a shutter controller 9, a processor 10, a memory 12, and a pattern recognizer 30. These components constitute a control section.

The optical detector 6 is fixed near the wafer stage 14. The exposing light passing through the lens system 5 is illuminated to the resist film 13, which is termed an incident light 7a, here. The incident light 7a partially penetrates the resist film 13, reflected by the underlying wafer 11, and penetrate the film 13 again to emit therefrom. The reflected light thus emitted is termed a reflected light 7b.

The detector 6 detects the reflected light 7b and outputs an output signal S1 to the amplifier 8. The amplifier amplifies the output signal S1 thus received and outputs an amplified output signal S2. The amplified output signal S2 is inputted into the processor 10.

The output signal S1 from the detector 6 has a specific relationship with the intensity or strength of the reflected light 7b. For example, the signal S1 is proportional to the intensity or strength of the reflected light 7b. Consequently, the signal S1 and the amplified output signal S2 from the amplifier 8 contain a data of the intensity of the reflected light 7b.

The processor 10 has three main functions as follows:

The first function is to calculate an optimum exposing time from the inputted signal S2.

The second function is to store the data of the optimum exposing time thus calculated in the memory 12 and read out the stored data as necessary as a signal S3.

The third function is to output a control signal S4 to the shutter controller 9 so that the shutter 3 opens the optical path synchronized with the start of exposure and closes after the time period according to the optimum exposing time.

In response to the control signal S4, the shutter controller 9 outputs a signal S5 to the shutter 3 to open or close the shutter 3, thereby opening or closing the optical path of the exposing light to the wafer 11 on the stage 14.

The pattern recognizer 30 has a function of recognizing the pattern rate $(S_0/S_t)$ of the mask 4 and of outputting an output signal S6 to the processor 10.

Next, the exposure method according to the first embodiment will be explained below with reference to FIGS. 5A, 5B and 6.

Figure 5A:
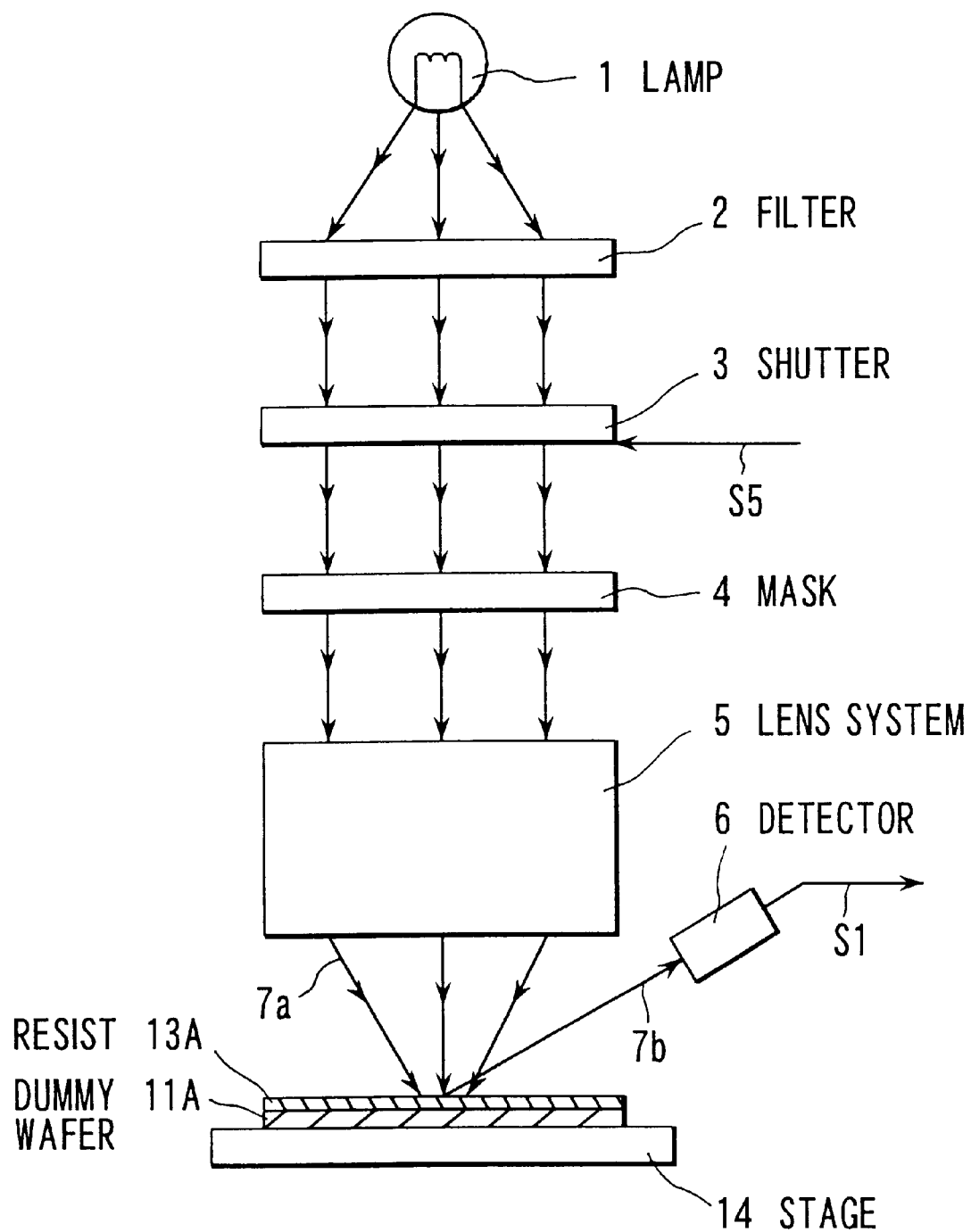
FIG. 5A is a schematic cross-sectional view showing an exposure method according to a first embodiment of the invention, in which a dummy wafer with a dummy resist film is placed on the wafer table.
Figure 5B:
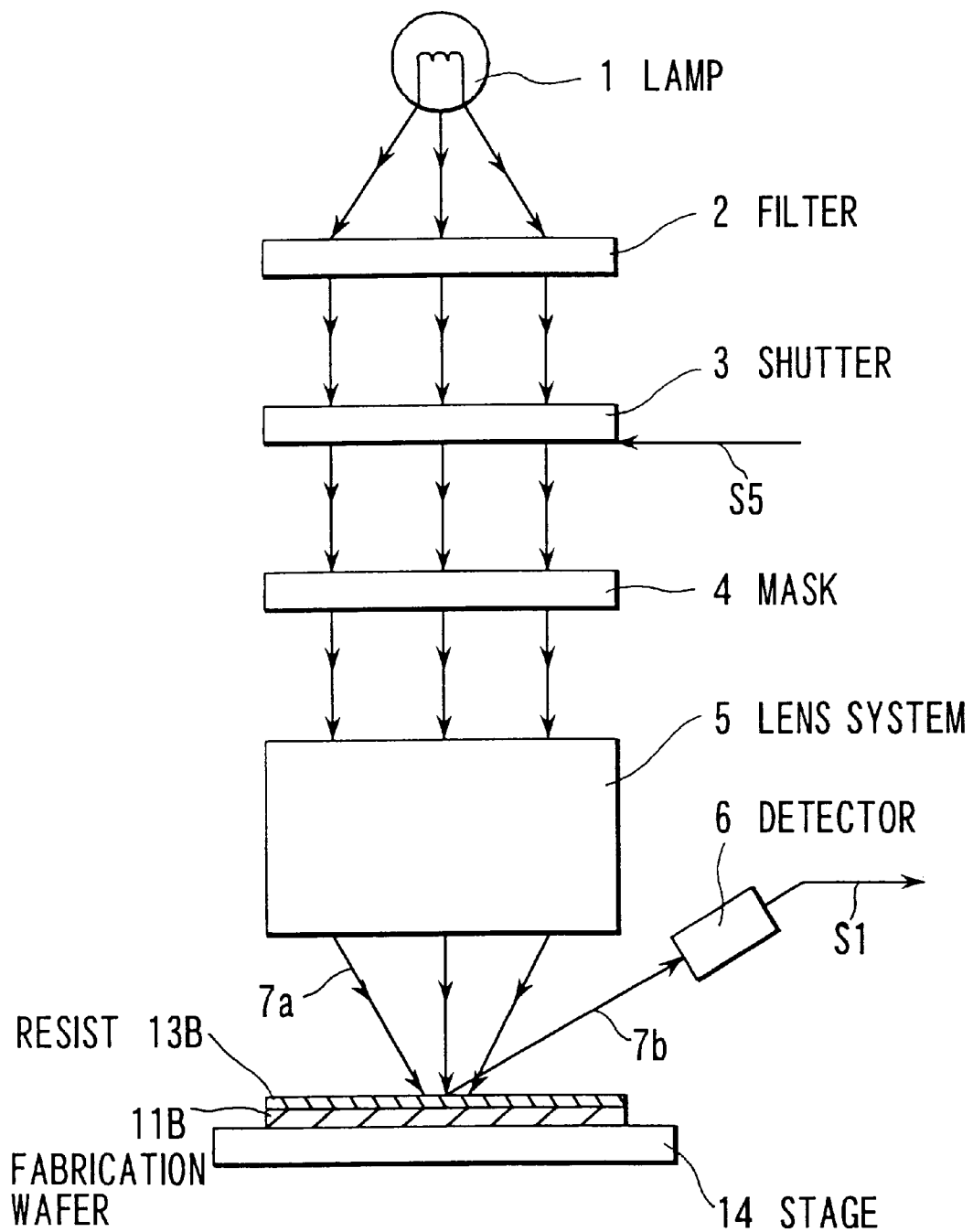
FIG. 5B is a schematic cross-sectional view showing the exposure method according to the first embodiment of the invention, in which a fabrication wafer with a fabrication resist film is placed on the wafer table.

First, as shown in FIG. 5A, a first optical resist film 13A is formed on a first semiconductor wafer 11A. The wafer 11A is then placed and held on the wafer stage 14.

Second, the exposing light is projected to the first resist film 13A through the filter 2, shutter 3, mask 4 and lens system 5. The incident light 7a is illuminated to the resist film 13A and the reflected light 7b by the wafer 11A enters the detector 6 (first exposure process).

The detector outputs the output signal S1 to the amplifier 8 and the amplifier 8 outputs the amplified signal S2 to the processor 10. Thus, the processor 10 obtains the intensity data of the reflected light 7b during this first exposure process.

Using the intensity data of the reflected light 7b at the start of the first exposure process, the processor 10 calculates an optimum exposure time for the resist film 13A and the wafer 11A.

Figure 6:
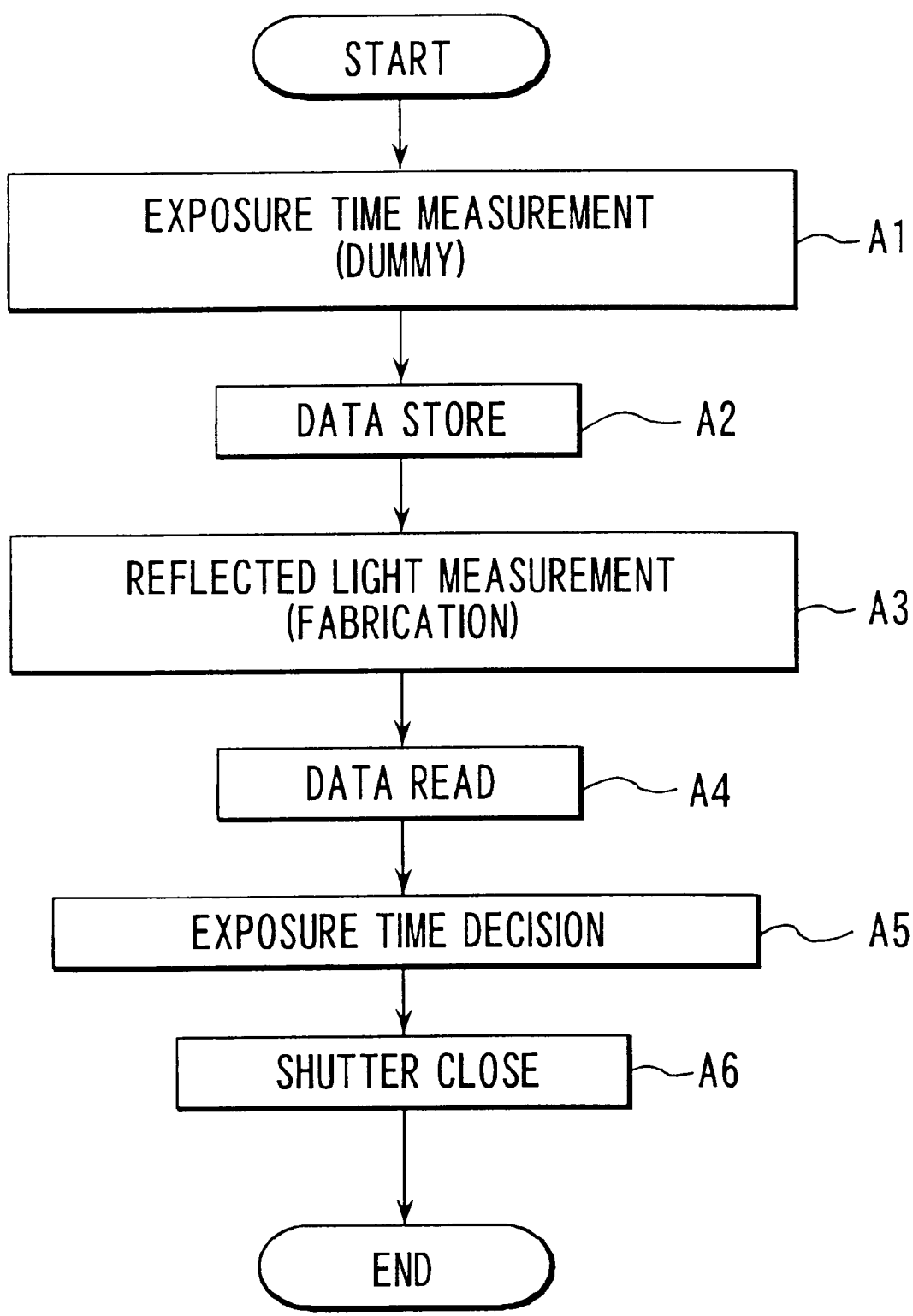
FIG. 6 is a flow chart showing the exposure method according to the first and second embodiments of the invention.

The above processes correspond to the step A1 of exposure time measurement for the dummy resist and wafer shown in FIG. 6.

In the present invention, the wording "at the start of the exposure" means a very short period (for example, 1 msec or less) from the start of the exposure process. The value of this period may be optionally designed if the intensity data of the reflected light 7b is suffered from substantially no effect caused by the chemical reaction of the resist film.

The processor 10 stores the calculated data of the optimum exposure time in the memory 12 (step A2 in FIG. 6).

Prior to expose a second resist film 13B formed on a second wafer 11B for semiconductor device fabrication (i.e., second exposure process), the first wafer 11A with the first resist film 13A serving as a dummy wafer is removed from the wafer stage 14.

The second optical resist film 13B is formed on the second semiconductor wafer 11B. The wafer 11E is then placed and held on the wafer stage 14, as shown in FIG. 5B,.

Following this, the same exposing light as used for the dummy wafer 11A is projected to the second resist film 13B through the filter 2, shutter 3, mask 4 and lens system 5. The incident light 7a is illuminated to the resist film 13B and the reflected light 7b by the wafer 11B enters the detector 6. The detector outputs the output signal S1 to the amplifier 8 and the amplifier 8 outputs the amplified signal S2 to the processor 10.

Thus, the processor 10 obtains the intensity data of the reflected light 7b at the start of the second exposure process for the second resist film 13B (step A3 in FIG. 6).

Subsequently, the processor 10 read out the data of the optimum exposure time stored in the memory 12 (step A4 in FIG. 6).

Then, the processor 10 decides the optimum exposure time for the second resist film 11B and the second wafer 11B to accord with the data of the optimum exposure time thus read out (step A5 in FIG. 6).

The processor 10 counts the opening time of the shutter 3 (i.e., the exposure time of the second resist film 13B) from the start of the second exposure process. When the counted opening time accords with the decided optimum exposure time, the processor 10 outputs the control signal S4 to the shutter controller 9 to close the shutter 3.

In response to the signal S4, the shutter controller 9 outputs the signal S5 to thereby close the shutter 3 (step A6 in FIG. 6).

Thus, the second resist film 13B is controlled to be exposed to the exposing light during the decided optimum exposure time. This means that the exposure time for the second resist film 13B is optimized.

With the exposure method according to the first embodiment, the optimum exposure time is measured using the first optical resist film 13A and the first semiconductor wafer 11A, and the data thus obtained is stored in the memory 12. Then, the second optical resist film 13B on the second semiconductor wafer 11B is exposed to the same exposing light, and the intensity of the reflected light 7b for the second resist film 13B and the second wafer 11B at the start of exposure is measured. The stored data of the optimum exposure time for the first resist film 13A and the first wafer 11A is read out and is used as the optimum exposure time for the second resist film 13B and the second wafer 11B.

Accordingly, the exposure time for the second resist film 13B and the second wafer 11B is optimized independent of the chemical reaction of the resist film 13B due to optical exposure, because the intensity data of the reflected light 7b at the start of exposure is used.

Figure 3:
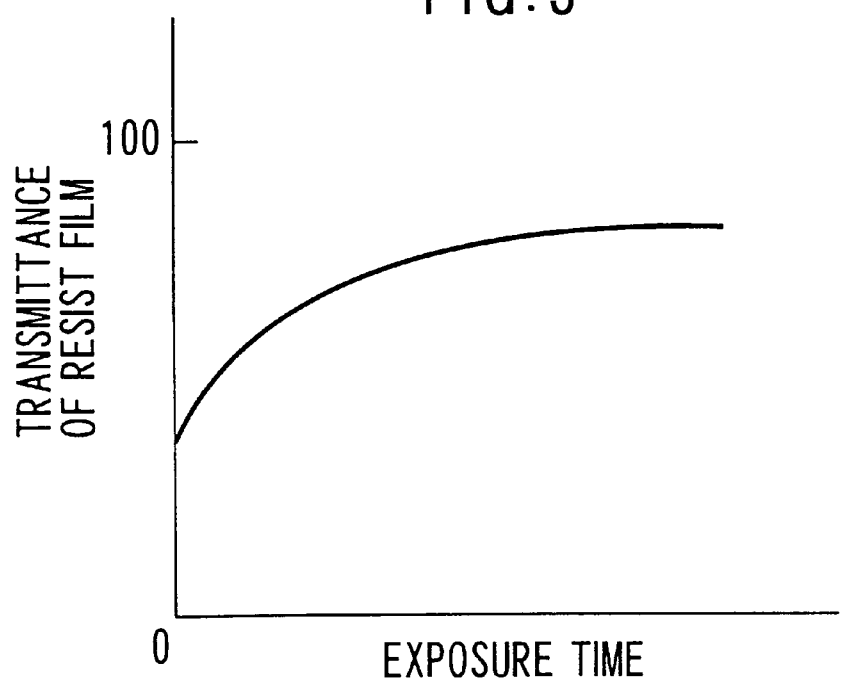
FIG. 3 is a graph showing the relationship between the exposure time and the transmittance of the optical resist film.

As shown in FIG. 3, generally, the transmittance of an optical resist film increases with the exposure time. Specifically, the transmittance increases abruptly in the initial period, and it increases gradually after the initial period. The method according to the first embodiment was invented considering this fact.

Also, the exposure time for the second optical resist film 13B and the second semiconductor wafer 11B is optimized even if the resist film 13B has some thickness fluctuation.

Further, by setting the opening time of the shutter 3 as the value according to the stored data of the optimum exposure time for the first resist film 13A, the shutter 3 can be controlled to optimize the exposure of the second optical resist film 13B.

SECOND EMBODIMENT

An exposure method according to a second embodiment, which can be performed using the exposure system shown in FIG. 2, is the same in process step as that of the first embodiment except that the exposure energy of the resist film per unit time is used, instead of the intensity of the reflected light at the start of exposure.

Figure 4:
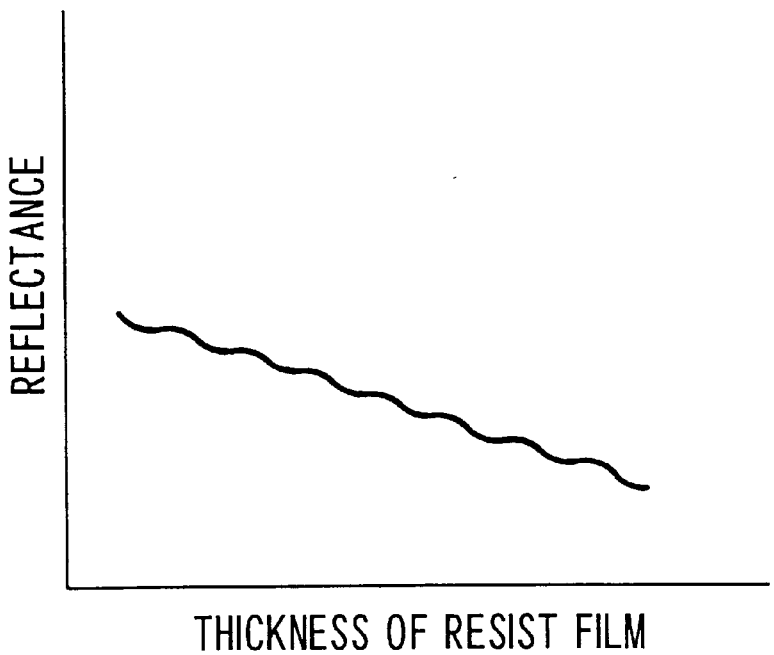
FIG. 4 is a graph showing the relationship between the thickness of the optical resist film and the reflectance of the semiconductor wafer.

As shown in FIG. 4, generally, the reflectance of an optical resist film monotonously decreases with the thickness of the resist film. The method according to the second embodiment was invented considering this fact.

Specifically, in the step A1 of FIG. 6, the exposure energy of the resist film per unit time is measured by the processor 10 using the measured intensity data of the reflected light 7b at the start of exposure. This measurement is repeated for various thickness values of the first (dummy) resist film 13A. The exposure energy data for various thickness values, which are affected by the thickness value of the resist film 13A, are stored in the memory 12 in the step A2 of FIG. 6.

In the step A3 of FIG. 6, the intensity of the reflected light 7b is measured for the second (fabrication) resist film 13B.

In the step A4 of FIG. 6, the processor 10 reads out from the memory 12 the exposure energy data according to the measured intensity data of the reflected light 7b for the second resist film 13B.

In the step A5 of FIG. 6, the processor 10 calculates the optimum exposure time of the second resist film 13B by dividing the predesigned value of the total exposure energy of the film 13B by the read-out value of the exposure energy per unit time. Thus, the optimum exposure time for the resist film 13B with the specific thickness is decided.

The predesigned value of the total exposure energy of the film 13B is usually given through the measurement using a reference resist film.

In the step A6 of FIG. 6, the shutter 3 is closed in the same way as that of the first embodiment.

In the method according to the second embodiment, the same advantages as those in the first embodiment can be obtained.

THIRD EMBODIMENT

An exposure method according to a third embodiment also can be performed using the exposure system shown in FIG. 2. This method is the same in process step as that of the first embodiment except that the intensity data of the reflected light 7b at the start of exposure is compensated corresponding to the pattern rate $(S_o/S_t)$ of the mask 4.

The detector 6 detects the reflected light 7b in order to obtain the reflectance of the wafer 11. If the intensity of the incident light 7a is kept constant, the equality of the intensity of the incident light 7a means the equality of the reflectance. However, the incident light 7a varies dependent upon the pattern rate $(S_o/S_t)$ of the mask 4. Accordingly, to compensate the effect of the pattern rate $(S_o/S_t)$, the pattern recognizer 30 is used.

Specifically, if the area $S_o$ of the opaque region 15 increases on the same mask 4, the intensity of the reflected light 7b will decrease. Therefore, even if the exposing light emitted from the lamp 1 is not changed, the intensity of the incident light 7a passing through the transparent region 16 of the mask 4 will vary. As a result, the intensity data of the reflected light 7b is required to be compensated according to the pattern rate $(S_o/S_t)$ of the mask 4.

Figure 7:
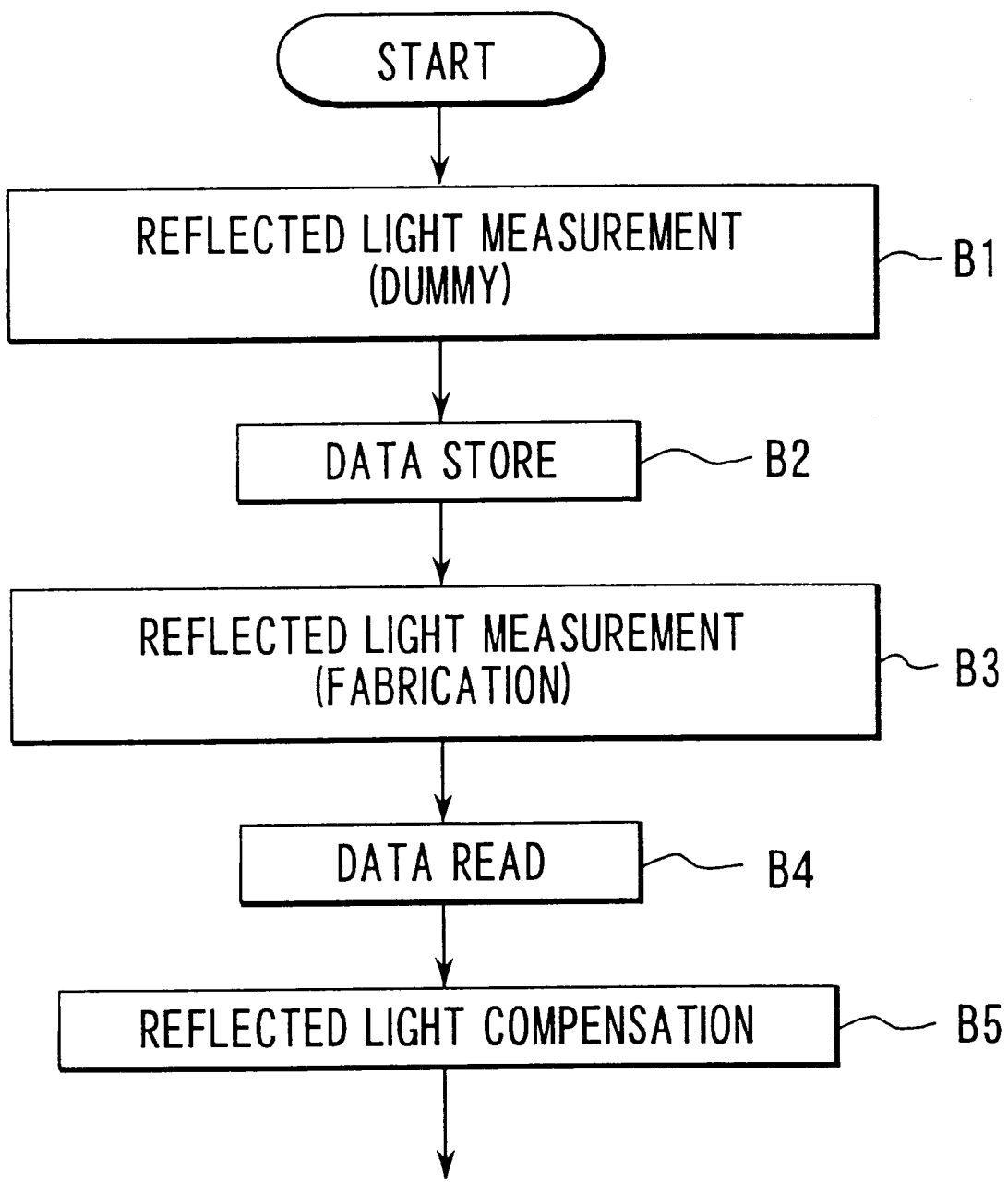
FIG. 7 is a flow chart showing a part of an exposure method according to a third embodiment of the invention.

In the exposure method according to the third embodiment, as shown in FIG. 7, while the intensity of the exposing light emitted from the lamp 1 is kept constant and the value of the pattern rate $(S_o/S_t)$ of the mask 4 is changed, the intensity of the reflected light 7b for the first resist film 13A and the first wafer 11A is measured (step B1).

The intensity data of the reflected light 7b for the various values of the pattern rate $(S_o/S_t)$ thus obtained is stored in the memory 12 (step B2).

Subsequently, the intensity of the reflected light 7b for the second resist film 13B and the second wafer 11B is measured (step B3).

Then, the processor 10 reads out the stored data in the memory 12 to thereby compensate the measured intensity data of the reflected light 7b for the second resist film 13B and the second wafer 11B (steps B4 and B5).

Thereafter, the optimum exposure time is obtained and then, the shutter 3 is closed to realize the optimum exposure time in the same way as that of the first embodiment.

In the method according to the third embodiment, the same advantages as those in the first embodiment can be obtained. Also, the exposure fluctuation can be further restricted than that of the first embodiment.

For example, this compensation enables that the exposure fluctuation is restricted within ±1% and as a result, the fluctuation of the transferred features on the resist film 13 is readily kept within ±0.03 µm.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An exposure method comprising the steps of:
   (a) preparing a first optical resist film formed at a first semiconductor wafer;
   (b) illuminating an exposing light to said first resist film;
   (c) measuring the intensity of a reflected light reflected by an underlying base material on said first wafer at the start of exposure;
   (d) measuring an optimum exposure time for said first resist film and said first wafer;
   (e) storing a data of said optimum exposure time in a memory;
   (f) preparing a second optical resist film formed at a second semiconductor wafer;
   (g) illuminating said exposing light used in said step (b) to said second resist film;

(h) measuring the intensity of a reflected light reflected by an underlying base material on said second wafer at the start of exposure;

(h) reading out said data of said optimum exposure time stored in said memory; and (i) deciding the exposure time for said second resist film and said second wafer to accord with said data of said optimum exposure time thus read out.

2. The exposure method as claimed in claim 1, wherein an exposure energy per unit time is used instead of said intensity of said reflected light at the start of exposure.

3. The exposure method as claimed in claim 1, further comprising the step of compensating said intensity data of said reflected light at the start of exposure for said first resist film according to the "pattern rate" of said mask.

4. The exposure method as claimed in claim 2, further comprising the step of compensating said intensity data of said reflected light at the start of exposure for said first resist film according to the "pattern rate" of said mask.

5. An exposure system comprising:

a light source for producing an exposing light;

a wafer stage for carrying a semiconductor wafer thereon;

a shutter between said light source and said wafer stage for opening and closing an optical path of said exposing light directed towards said wafer stage;

an optical lens system disposed in said optical path for projecting said exposing light onto an optical resist film formed on said wafer;

a detector for detecting reflected light reflected by a base material of said resist film and provide a read out of intensity data of said reflected light;

a shutter controller for controlling said shutter to open and close in response to a control signal;

a processor for calculating optimum exposing time from intensity data of said reflected light obtained by said detector, for storing the intensity data thus calculated, and for outputting a control signal to said shutter controller whereby to control the opening and closing of said shutter, and thus the exposure, according to said calculated optimum exposing time and a pattern recognizer for recognizing the pattern on said mask and for outputting a compensation signal to said processor.

\* \* \* \* \*

UNITED STATES PATENT AND TRADEMARK OFFICE
CERTIFICATE OF CORRECTION

PATENT NO. : 5,999,247
DATED : December 7, 1999
INVENTOR(S) : Tatsurou Tezuka

It is certified that error appears in the above-identified patent and that said Letters Patent is hereby corrected as shown below:

Title page,
Item [54], change Title to read: -- AN EXPOSURE APPARATUS AND METHOD WHICH DETERMINES OPTIMUM EXPOSURE TIME BY CONSIDERING THE OPTICAL CHARACTERISTICS OF THE RESIST FILM --

Column 8,
Line 55, change "illuminating" to -- projecting -- and change "to" to -- onto --.
Line 56, delete "a reflected".
Line 61, delete "a" (first occurrence).
Line 65, change "illuminating" to -- projecting --.
Line 66, change "to" to -- onto --.

Column 9,
Line 1, delete "a reflected".
Line 4, change "(h)" to -- (i) --.
Line 6, change "(i) deciding" to -- (j) controlling -- and change "for" to -- of --.
Line 13, change "compensating said" to -- adjusting the --.
Line 17, change "compensating said" to -- adjusting the --.

Signed and Sealed this

Twenty-first Day of October, 2003

JAMES E. ROGAN
*Director of the United States Patent and Trademark Office*